US010184979B2

(12) United States Patent
Ding et al.

(10) Patent No.: US 10,184,979 B2
(45) Date of Patent: Jan. 22, 2019

(54) IC DEVICE-IN-POCKET DETECTION WITH ANGULAR MOUNTED LASERS AND A CAMERA

(71) Applicant: Delta Design, Inc., Poway, CA (US)

(72) Inventors: Kexiang Ken Ding, San Diego, CA (US); Chris Do, Poway, CA (US); James Frandsen, Ramona, CA (US)

(73) Assignee: Delta Design, Inc., Poway, CA (US)

(*) Notice: Subject to any disclaimer, the term of this patent is extended or adjusted under 35 U.S.C. 154(b) by 59 days.

(21) Appl. No.: 15/232,243

(22) Filed: Aug. 9, 2016

(65) Prior Publication Data
US 2017/0045577 A1 Feb. 16, 2017

Related U.S. Application Data

(60) Provisional application No. 62/203,132, filed on Aug. 10, 2015.

(51) Int. Cl.
G01R 31/28 (2006.01)
G01S 17/46 (2006.01)
G01B 11/27 (2006.01)

(52) U.S. Cl.
CPC ........ *G01R 31/2891* (2013.01); *G01B 11/272* (2013.01); *G01R 31/2865* (2013.01); *G01S 17/46* (2013.01)

(58) Field of Classification Search
CPC . G01R 31/2891; G01R 31/2865; G01S 17/46; G01B 11/25; G01B 11/272
(Continued)

(56) References Cited

U.S. PATENT DOCUMENTS 5,424,823 A * 6/1995 Nettles .................. G01S 7/4802
356/5.01
5,436,724 A * 7/1995 Ishizuka .................. G01D 5/38
250/237 G
(Continued)

FOREIGN PATENT DOCUMENTS

KR 20030084407 A * 11/2003
KR 20030084407 A * 11/2003
(Continued)

OTHER PUBLICATIONS

International Search Report and Written Opinion dated Oct. 28, 2016 in related Int'l Appl. PCT/US2016/046148 (12 pgs.).

*Primary Examiner* — Jermele M Hollington
*Assistant Examiner* — Sean Curtis
(74) *Attorney, Agent, or Firm* — Foley & Lardner LLP

(57) ABSTRACT

An apparatus includes a device holder including a device placement area configured to hold an electronic device, and a shoulder extending peripherally around the device placement area; a laser line generator configured to generate a laser line that includes (i) a device placement area laser line portion, and (ii) a shoulder area laser line portion; a camera configured to obtain an image of at least the laser line; and a processor configured to: receive the image from the camera, determine (i) an angle of the device placement area laser line portion, and/or (ii) an offset between the location of the device placement area laser line portion and the location of the shoulder area laser line portion, and determine whether an electronic device is positioned in the device placement area or positioned incorrectly in the device holder.

40 Claims, 6 Drawing Sheets

(58) Field of Classification Search
USPC .................................. 324/750.16, 750.23
See application file for complete search history.

(56) References Cited

U.S. PATENT DOCUMENTS

| | | | | |
|---|---|---|---|---|
| 5,463,227 A * | 10/1995 | Stern | ................... | G01B 11/022 250/559.29 |
| 5,600,150 A * | 2/1997 | Stern | ................... | G01B 11/022 250/559.29 |
| 5,741,096 A * | 4/1998 | Olds | ................... | B23Q 17/22 408/1 R |
| 5,780,839 A * | 7/1998 | Livingston | ............ | F41H 13/005 250/203.2 |
| 5,793,051 A * | 8/1998 | Stern | ...................... | H05K 13/08 250/559.2 |
| 5,818,061 A * | 10/1998 | Stern | ................... | G01B 11/022 250/559.29 |
| 5,900,940 A * | 5/1999 | Aoshima | ............ | G01B 11/2433 250/559.34 |
| 6,710,868 B2 * | 3/2004 | Guetta | .................... | G01N 21/94 250/201.2 |
| 7,781,901 B2 * | 8/2010 | Tanemura | ........... | H01L 23/5258 257/797 |
| 8,041,533 B2 * | 10/2011 | Ding | ........................ | G01S 17/89 250/550 |
| 8,237,935 B2 * | 8/2012 | Nygaard | ............ | G01B 11/2425 250/559.24 |
| 9,557,375 B2 * | 1/2017 | Kabbani | ............ | G01R 31/2891 |
| 2001/0027995 A1 * | 10/2001 | Patel | .................. | G06K 7/10861 235/383 |
| 2002/0126732 A1 * | 9/2002 | Shakouri | ................... | G01J 5/00 374/130 |
| 2003/0174209 A1 * | 9/2003 | Piazzi | ................ | G06K 7/10722 348/135 |
| 2008/0251950 A1 * | 10/2008 | Tanemura | ........... | H01L 23/5258 257/797 |
| 2009/0281762 A1 * | 11/2009 | Ding | ...................... | G01S 17/875 702/150 |
| 2010/0201806 A1 * | 8/2010 | Nygaard | ............ | G01B 11/2425 348/92 |
| 2014/0218512 A1 * | 8/2014 | Tseng | ................. | G01B 11/0608 348/140 |
| 2015/0015286 A1 * | 1/2015 | Ding | .................. | G01R 31/2891 324/750.23 |
| 2015/0352666 A1 * | 12/2015 | Fujita | ..................... | B23K 26/14 219/121.61 |
| 2015/0369861 A1 * | 12/2015 | Kabbani | ............ | G01R 31/2891 324/750.23 |
| 2017/0045577 A1 * | 2/2017 | Ding | .................... | G01B 11/272 |
| 2017/0285102 A1 * | 10/2017 | Ding | .................. | G01R 1/07314 |

FOREIGN PATENT DOCUMENTS

| | | | |
|---|---|---|---|
| KR | 20120093689 A | * | 8/2012 |
| KR | 20120093689 A | * | 8/2012 |
| KR | 101207876 B1 | * | 12/2012 |
| KR | 101207876 B1 | * | 12/2012 |

* cited by examiner

IC DEVICE-IN-POCKET DETECTION WITH ANGULAR MOUNTED LASERS AND A CAMERA

BACKGROUND OF THE INVENTION

The following description of the background of the invention is provided to aid in understanding the invention and is not admitted to describe or constitute prior art to the invention.

The present invention relates generally to the field of integrated circuit manufacturing and testing. Specifically, the present invention is directed toward a detection apparatus and method for determining the position and orientation of an integrated circuit (IC) device.

Many techniques have been developed for detecting the position of an object such as an integrated circuit. For example, lasers have been used in position detection applications, as described in U.S. Pat. No. 8,041,533 ("the '533 patent"), which is incorporated by reference in its entirety for the background and techniques described therein. However, the system of the '533 patent utilizes two laser lines with a cross pattern. In some systems, there is not enough room to put two laser line generators.

SUMMARY OF THE INVENTION

According to one embodiment, an apparatus includes a device holder comprising a device placement area configured to hold an electronic device, and a shoulder extending peripherally around the device placement area; a laser line generator configured to generate a laser line that includes (i) a device placement area laser line portion extending across at least a portion of the device placement area or at least a portion of an electronic device held in the device placement area, and (ii) a shoulder area laser line portion extending across at least a portion of the shoulder; a camera configured to obtain an image of at least the laser line generated by the laser line generator; and a processor configured to: receive the image from the camera, determine (i) an angle of the device placement area laser line portion, and/or (ii) an offset between the location of the device placement area laser line portion and the location of the shoulder area laser line portion, and determine, based on a comparison between said angle and/or offset and a predetermined normal angle and/or normal offset, at least one of (i) whether an electronic device is positioned in the device placement area, (ii) whether an electrical device is positioned incorrectly in the device holder, (iii) whether two electronic devices are improperly double-stacked in the device holder, and (iv) whether no electronic device is located in the device placement area.

According to another embodiment, a method includes providing a device holder comprising a device placement area configured to hold an electronic device, and a shoulder extending peripherally around the device placement area; generating, with a laser line generator, a laser line that includes (i) a device placement area laser line portion extending across at least a portion of the device placement area or at least a portion of an electronic device held in the device placement area, and (ii) a shoulder area laser line portion extending across at least a portion of the shoulder; obtaining, with a camera, an image of at least the laser line generated by the laser line generator; transferring the image from the camera to a processor; determining, with the processor, at least one of (i) an angle of the device placement area laser line portion, and (ii) an offset between the location of the device placement area laser line portion and the location of the shoulder area laser line portion; and determining, with the processor, based on a comparison between said at least one of the angle and the offset and a predetermined normal angle and/or normal offset, at least one of (i) whether an electronic device is positioned in the device placement area, (ii) whether an electrical device is positioned incorrectly in the device holder, (iii) whether two electronic devices are improperly double-stacked in the device holder, and (iv) whether no electronic device is located in the device placement area.

It is to be understood that both the foregoing general description and the following detailed description are exemplary and explanatory only, and are not restrictive of the invention as claimed.

BRIEF DESCRIPTION OF THE DRAWINGS

Features, aspects and advantages of the present invention will become apparent from the following description, appended claims, and the accompanying exemplary embodiments shown in the drawings, which are briefly described below.

DETAILED DESCRIPTION OF THE PREFERRED EMBODIMENTS

Embodiments of the present invention will be described below with reference to the accompanying drawings. It should be understood that the following description is intended to describe exemplary embodiments of the invention, and not to limit the invention.

Figure 1:
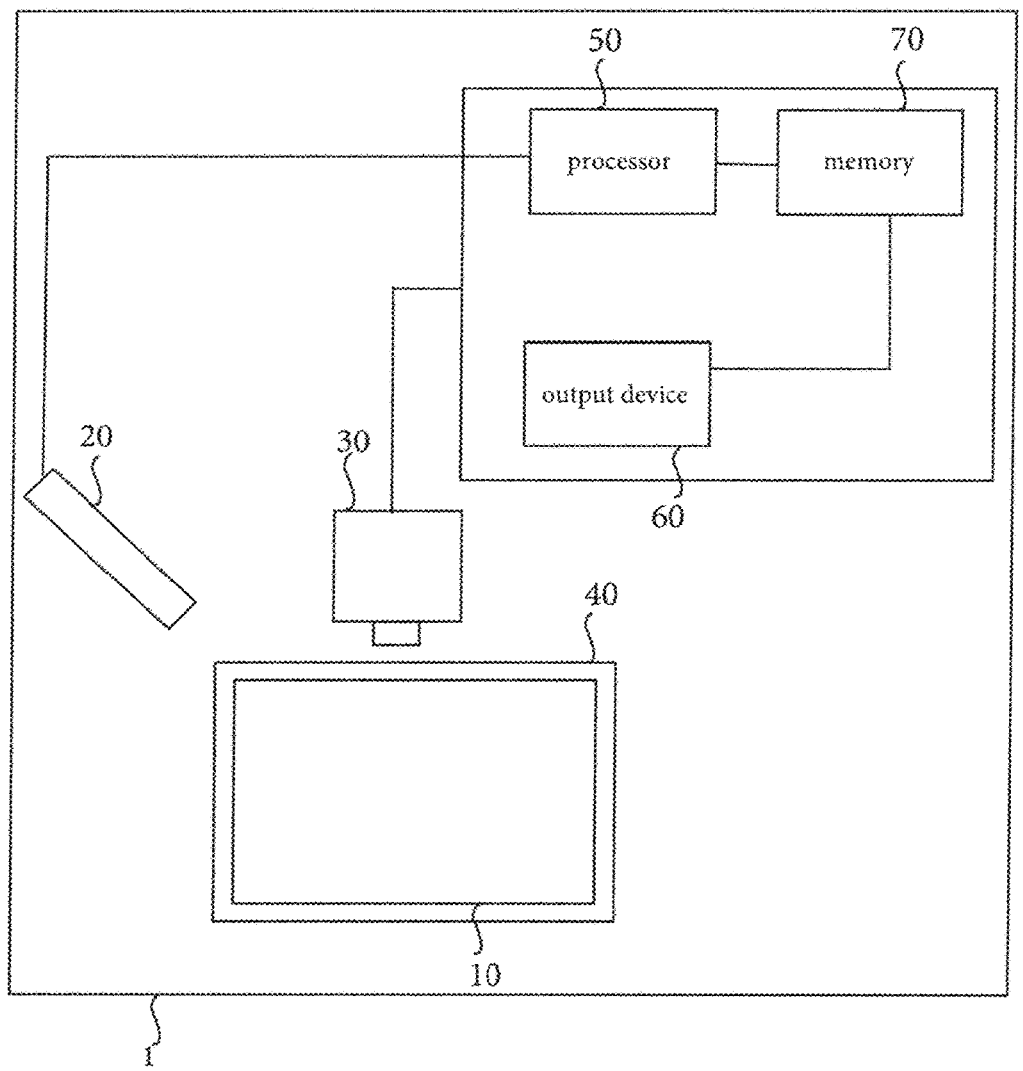
FIG. 1 is a block diagram of a detection apparatus, according to one embodiment.

FIG. 1 is a detection apparatus 1 for detecting a device 10 according to one embodiment. The device 10 can be a semiconductor device, integrated circuit or the like. The detection apparatus 1 has a laser line generator 20 and a camera 30. A device 10 may be located in a device holder 40 positioned below the laser generator 20 and camera 30. The device holder is either a test socket (i.e., a socket having contacts, such as a pogo pin array, used to test the device) or a pocket (such as a pocket on a tray used to carry one or more devices 10, typically without any contacts). A device 10 can be placed in a device placement area of the device holder 40. The detection apparatus 1 can determine whether the device holder 40 is empty, is properly holding the device 10, is improperly holding the device 10, or is improperly holding more than one device 10 (i.e., when devices are double stacked in the device holder). In some embodiments, the detection apparatus can further determine whether the device holder 40 (such as a test socket) is missing, misplaced, damaged, of the wrong type, and/or has experienced thermal expansion.

Still referring to FIG. 1, a processor 50 is operably connected to the camera 30 for executing vision software to analyze the images captured by the camera 30. The processor 50 is operably connected to an output device 60, such as a display, for communicating information from the processor 50 to a user. In addition, the processor 50 is operably connected to a memory 70 for storing information generated by the processor.

The laser line generator 20 emits a beam forming a laser line. The beam is directed at the device holder 40 at an angle with respect to a direction perpendicular to an upper surface of the device holder 40. The laser generator 20 is angled with respect to a top surface of the device holder 40. For example, angle between the emission direction of the beam forming a laser line LL and a direction perpendicular to the top surface of the device holder 40 may be in a range of 30-60°.

Figure 2:
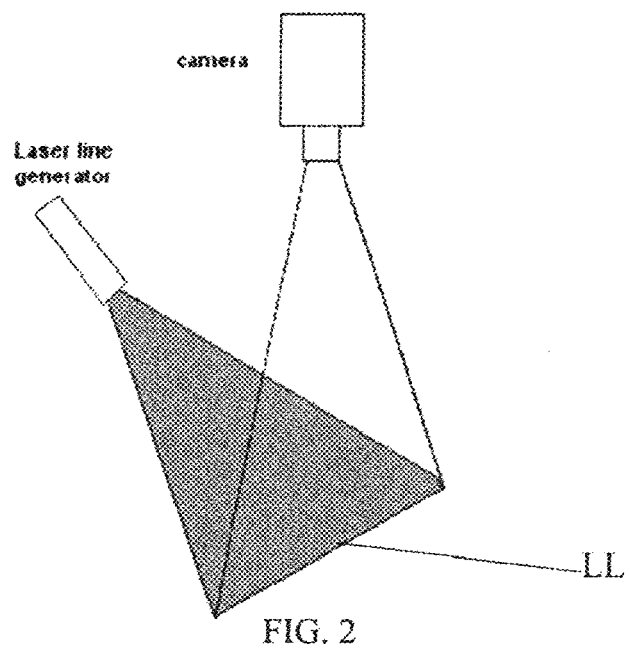
FIG. 2 is a block diagram of portions of a detection apparatus, according to one embodiment.
Figure 3:
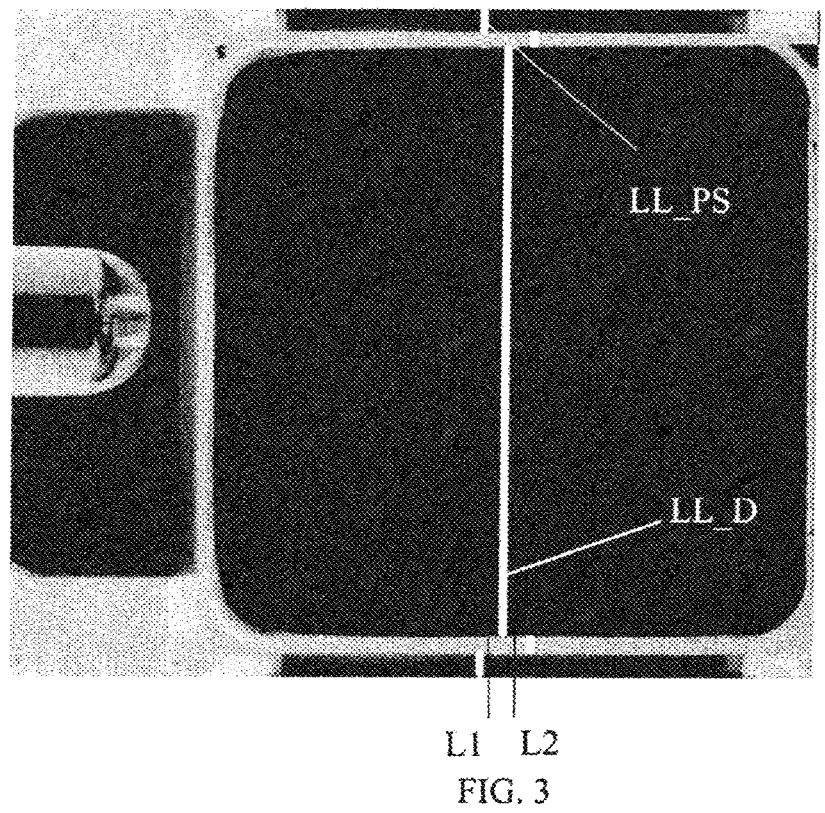
FIG. 3 is a top view of laser line portions being emitted on a device, according to one embodiment.
Figure 4:
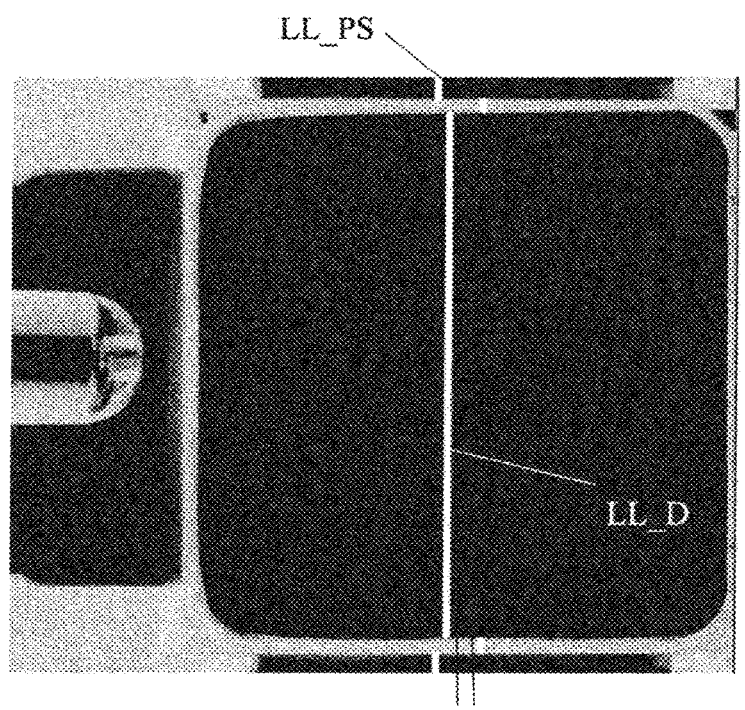
FIG. 4 is another top view of laser line portions being emitted on a device on top of another device, according to one embodiment.
Figure 5:
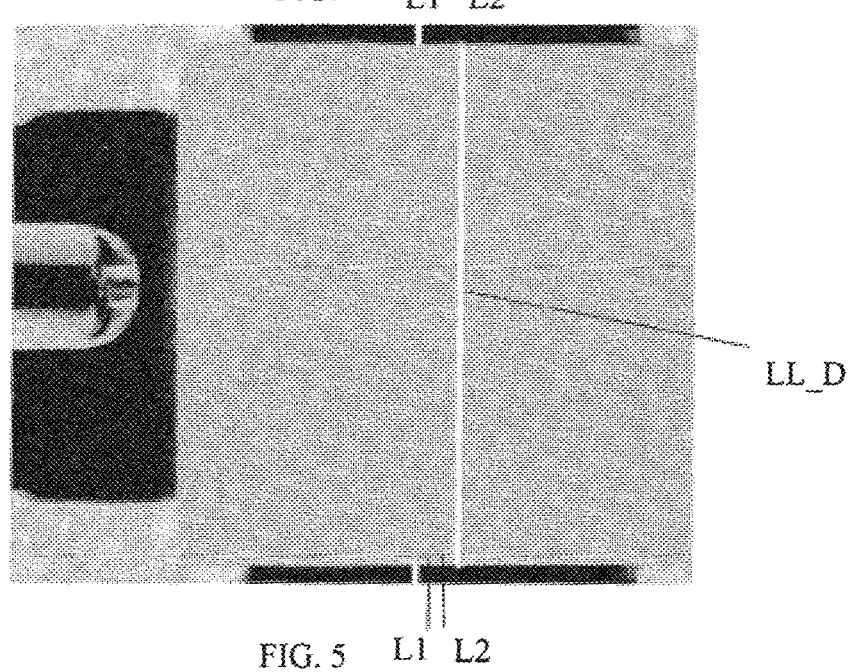
FIG. 5 is a top view of laser lines being emitted on an empty pocket, according to one embodiment.

In FIGS. 3-5, the laser generator 20 is mounted at a 45 degree angle. The laser generator 20 emits laser line portions LL on the surface 10, as shown in FIG. 2. According to one embodiment, the laser generator 20 may emit a red line laser line; however, a different pattern and/or color can be used as well.

The camera 30 captures the pattern formed by the laser line portions LL on the surface 10. That is, the camera 30 is configured to view the laser line portions LL generated by the laser line generator 20. For example, when a device 10 is present in the device holder 40, the laser line portions LL form a specific type of pattern on the device 10.

Referring again to FIG. 1, the device holder 40 includes a device placement portion in which the device 10 is placed, and a shoulder extending peripherally around the device placement area. The laser line generator 20 is configured to generate a laser line portions LL that include (i) a placement portion laser line portion LL_D extending across at least a portion of the device placement portion or at least a portion of the electronic device 10 held therein, and (ii) a shoulder area laser line portion LL_PS extending across at least a portion of the shoulder. The laser line portions LL are preferably projected onto flat surfaces of the device placement portion, device, and shoulder.

The images captured by the camera 30 are fed into the processor 50. The processor 50 analyzes the images and can determine whether there is a device 10 present and in the correct position (in-pocket), there are two or more devices 10 stacked upon each other (double stack), or if there is not a device 10 present (empty pocket). Further, the processor 50 is configured to receive from the camera 30 data containing information about a location of the pocket area laser line portion LL_D and a location of the shoulder area laser line portion LL_PS, and determine whether the electronic device 10 is positioned in the device placement area based on said data.

FIG. 3 is an example of the laser line pattern formed when a device 10 is located in the device placement area of the device holder 40 (in this case, a device pocket). The laser line portions LL include the shoulder area laser line portion LL_PS and pocket area laser line portion LL_D projected on the device 10, as described above. As shown in FIG. 3, the pocket area laser line portion LL_D is located to the right of the shoulder area laser line portion LL_PS. An in-pocket offset between the pocket area laser line portion LL_D and the shoulder area laser line portion LL_PS may be saved in the memory 70 to train the system as to the correct offset between the pocket area laser line portion LL_D and the shoulder area laser line portion LL_PS when the device 10 is properly located in the device holder 40.

Referring again to FIG. 3, the processor 50 is configured to determine that the electronic device 10 is positioned in the device placement area when an offset between the pocket area laser line portion LL_D and the shoulder area laser line portion LL_PS is within a predetermined range. A user may define a lower limit L1 and an upper limit L2 of an offset between the pocket area laser line portion LL_D and the shoulder area laser line portion LL_PS that is considered normal. The user may also set a lower limit and an upper limit for an angle of the laser line. The device 10 is detected as being located in the device placement area if the offset between LL_D and LL_PS is in a range between L1 and L2.

FIG. 4 is an example of the laser line pattern formed when two devices 10 are double stacked in the device holder 40 (in this case, a device pocket). As shown in FIG. 4, the offset between LL_D and LL_PS is less than the lower limit L1. The processor 50 is configured to determine that the two electronic devices are improperly double-stacked in the pocket when an offset between the pocket area laser line portion LL_D and the shoulder area laser line portion LL_PS is below a predetermined lower threshold value.

FIG. 5 is an example of the laser line pattern formed when no device 10 is located in the device holder 40 (in this case, a device pocket). As shown in FIG. 5, the offset between LL_D and LL_PS is greater than the upper limit L2. If an offset between LL_D and LL_PS is above a predetermined upper threshold, then the processor 50 determines that no device is positioned in the pocket.

Figure 6:
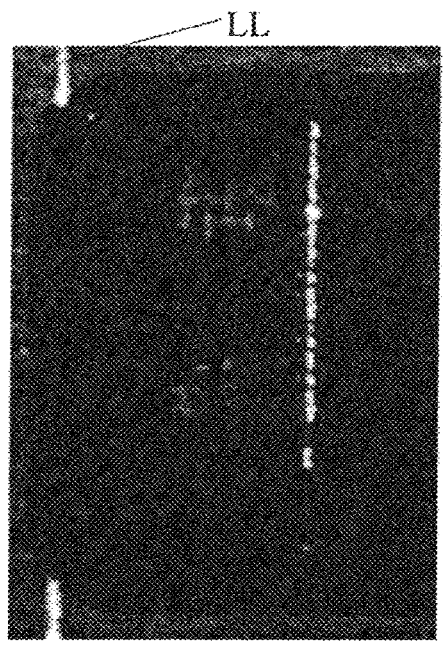
FIG. 6 is a top view of non-solid laser line portions being emitted on a test socket.

FIG. 6 is an example of the laser line pattern formed when no device 10 is located in the device holder 40 (in this case, a test socket having a pogo pin array). Where the device holder 40 is a test socket having contacts (as in FIG. 6), or where the device has a rough top surface, the laser line portions LL may not be solid lines. Rather, the laser line portions LL may be broken. To provide for robust detection of non-solid and solid laser lines alike, the detection apparatus 1 may employ laser line training with an image projection along the line to determine a normal offset of laser line portions generated by the laser line generator 20.

For example, the processor 50 may be configured to determine that the device 10 being properly disposed in the device holder 40 is a normal condition. In this case, the processor 50 may be trained such that a predetermined angle of pocket area laser line portion LL_D and/or a predetermined offset between the LL_D and LL_PS when the device 10 is properly disposed in the device holder 40 is "normal." Alternatively, the processor 50 may be configured to determine that the device holder 40 being empty is the normal condition. In this case, the processor 50 may be trained such that a predetermined angle of pocket area laser line portion LL_D and/or a predetermined offset between the LL_D and LL_PS when no device 10 is disposed in the device holder 40 is "normal."

Figure 7:
FIG. 7 is a top view of non-solid laser line portions being emitted on a device that is partially in a test socket.

FIG. 7 is an example of the laser line pattern formed when a device 10 is located only partially in the device holder 40 (in this case, a test socket). As seen in FIG. 7, the partial in socket device is partially on the shoulder with a different height from the socket surface. The device top surface is usually tilted because of that. Therefore, the laser line on the top of the tilted device surface is not parallel to the trained laser line LL.

Figure 8:
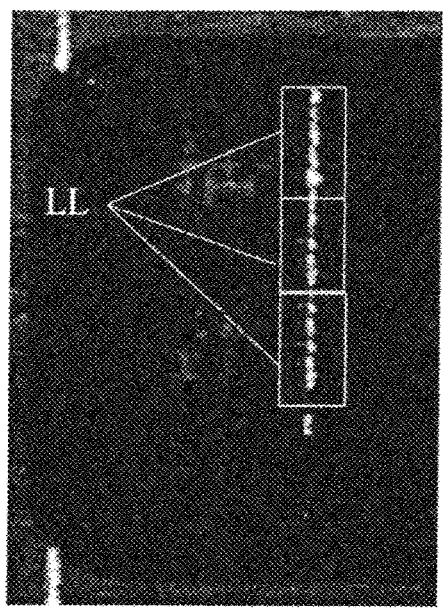
FIG. 8 is a top view of segmented non-solid laser line portions being emitted on a test socket without a device in it.

FIG. 8 is an example of the laser line pattern formed when no device 10 is located in the device holder 40 (in this case, a test socket having a pogo pin array). FIG. 8 shows how the laser line may be divided into multiple segments of equal length. The difference in position between the shoulder area laser line portion LL_PS and respective segments of the pocket area laser line portion LL_D may be used to determine whether a device 10 properly in or partially improperly in the pocket.

Figure 9:
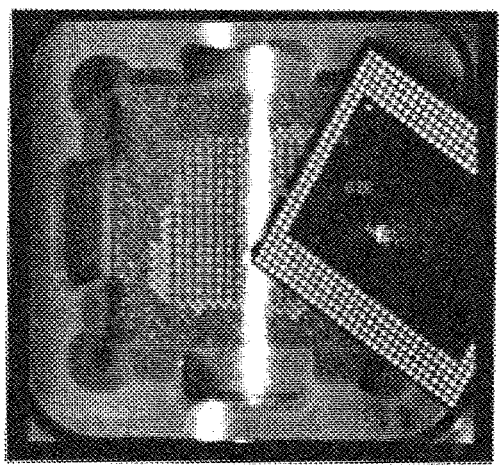
FIG. 9 is a top view of laser line portions being emitted on a device out of pocket.

In another embodiment, the system may utilize quadrant pattern matching process in addition to laser line. This embodiment may be used to detect instances in which a device 10 is improperly positioned in the device holder 40, but is not positioned in a way that significantly disturbs the laser line generated by the laser line generator. An example of such an instance is shown in FIG. 9. This embodiment is particularly useful when the processor 50 is configured to determine that the device holder 40 being empty is the normal condition, because a condition such as that in FIG. 9 may be judged "normal," when in fact there is a device 10 improperly located in the device holder 40.

Figure 10:
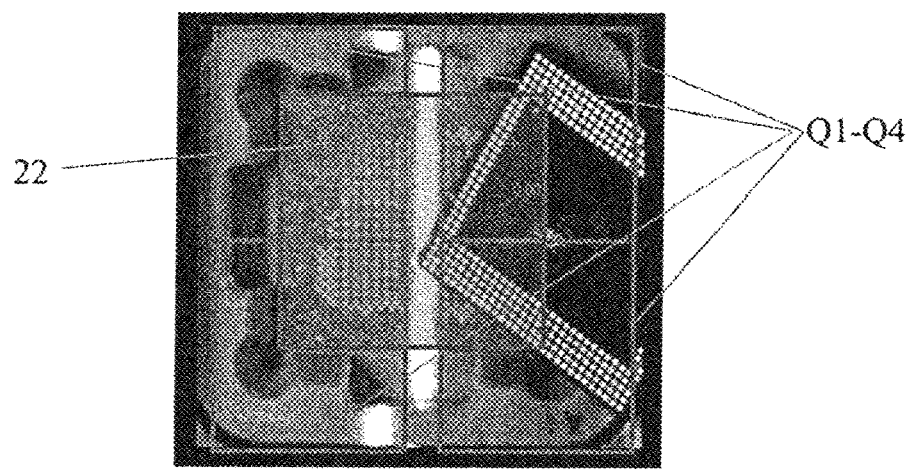
FIG. 10 is a top view of laser line portions being emitted on a device out of pocket including a masked pocket region.

To perform quadrant pattern matching, the processor 50 splits the image of the device holder 40 into one or more quadrants Q1-Q4. The process 50 compares detected images of the quadrants with normal images of the quadrants. Where the processor 50 is configured to determine that the device holder 40 being empty is the normal condition, the normal images are the trained images in which no device is located in the device holder 40. Where the processor 50 is configured to determine that the device 10 being properly disposed in the device holder 40 is a normal condition, the normal images are images in which a device 10 is located in the device holder 40. If the detected images of the one or more quadrants of device holder 40 match the normal images, then the device holder 10 is deemed to be in the normal condition. If the detected images of the one or more quadrants of device holder 40 do not match the normal images, then the device holder 10 is deemed to be in an abnormal condition. The quadrants include at least portions of edges of the device holder 10, as shown in FIG. 10. Because the laser line may not be bright enough to light the edges of the device holder 10, one or more bright field lights may be used to light the device holder 10 for quadrant pattern matching.

To aid in performing quadrant pattern matching, the region in which the laser line is formed is not included in the quadrants, because the bright laser line may dominate the matching score between the detected quadrant images and the normal quadrant images.

To aid in performing quadrant pattern matching, certain areas of the image of the device holder 10 may be masked. For example, because there may be regular variation in the location of contacts in a test socket, portions of the device holder image that include the contacts may be masked. For example, in FIG. 10, portions of the device holder 10 image including the pogo pin array are masked, so that each quadrant is L-shaped.

FIG. 10 is an example of quadrant pattern matching of a device 10 that is out of pocket 40. When the device 10 touches the edge of the pocket, it may not break the laser line LL significantly, and so the laser line LL may be detected as being normal. However, as shown in FIGS. 9 and 10, the edge of the pocket may nevertheless be blocked. To facilitate accurate determination of the position of the device 10, masks 22 are used in performing error detection processing by the processor 50, as shown in FIG. 10. Specifically, to avoid regular variations in the pocket from influencing the results, a region of the pocket may be masked using the mask 22.

Via the quadrant pattern matching, the detection apparatus 1 can determine whether the device 10 is improperly located in the device holder 40, even when the device 10 does not block the laser line. Such detection is accomplished without requiring a second laser generator 20, obviating the need to accommodate a second orthogonal laser in a detecting machine. The detection apparatus 1, accordingly, enjoys a more streamlined footprint and has increased cost-effectiveness and usability. Further, the detection apparatus 1 permits increased design freedom, at least because there is no need to ensure that a path of an additional laser is not blocked by machine parts. Moreover, such embodiments enhance accuracy and robustness of characterizations of the tilt and thickness variations of the device 10 or components thereof.

Figure 11:
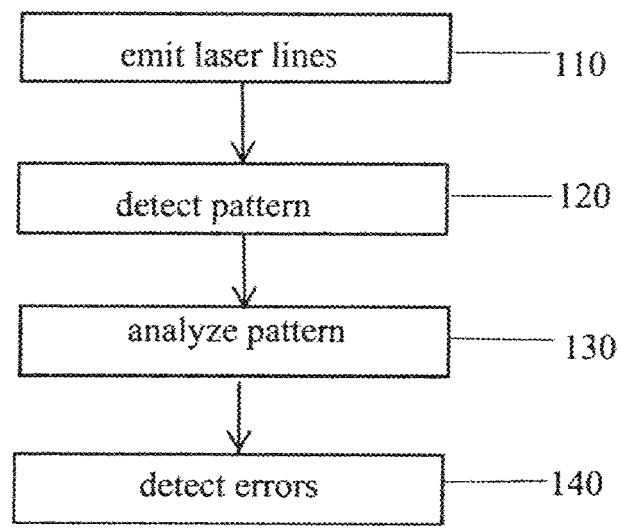
FIG. 11 is a flow chart illustrating a method for determining the presence and position of a device.

Operation of the detection apparatus 1 with reference to FIG. 11 will now be described. During operation, a device 10 is positioned in a pocket of a device holder 40, which has a shoulder extending peripherally around a device placement area. A laser line is emitted by the laser generator 20 on the device holder 40 and device 10 (when present), including the laser line portions LL_PS and LL_D as described above (Step 110). An image that the device holder, including the laser line formed on the device holder 40 and device 10 (when present) is obtained by the camera 30 (Step 120), and data from the camera is then transferred to the processor 50. The processor 50 analyzes data about the locations and angles of the laser line portions LL_PS and LL_D, and optionally additionally performed quadrant pattern matching (Step 130). The processor uses this information to detect errors (Step 140). For example, the processor 50 determined whether a device is properly located in device holder 40, double-stacked, or improperly located in device holder 40, or if the device holder 40 is empty.

Based on the description provided above, the detection apparatus 1 has distinct advantages. The detection apparatus provides an accurate and universal solution for identifying device placements in a pocket. In addition, the detection apparatus can be generated from existing handler equipment, thus, significantly reducing the cost for implementing the detection apparatus. Further, the detection apparatus can be used for various sensing applications including bent lead inspection, for example.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. An apparatus comprising: a device holder comprising a device placement area configured to hold an electronic device, and a shoulder extending peripherally around the device placement area; a laser line generator configured to generate a laser line that includes (i) a device placement area laser line portion extending across at least a portion of the device placement area or at least a portion of an electronic device held in the device placement area, and (ii) a shoulder area laser line portion extending across at least a portion of the shoulder; a camera configured to obtain an image of at least the laser line generated by the laser line generator; and a processor configured to: receive the image from the camera, determine an offset between the location of the device placement area laser line portion and the location of the shoulder area laser line portion, and determine, based on a comparison between said offset and a predetermined normal offset, at least one of (i) whether an electronic device is positioned in the device placement area, (ii) whether an electronic device is positioned incorrectly in the device holder, (iii) whether two electronic devices are improperly double-stacked in the device holder, and (iv) whether no electronic device is located in the device placement area.

2. The apparatus of claim 1, wherein the laser line generator is configured such that an emission direction of a beam forming the laser line is at an angle in a range of 30-60 degrees with respect to a direction perpendicular to an upper surface of the device placement area.

3. The apparatus of claim 1, wherein the processor is configured to divide the device placement area laser line portion into a plurality of laser line segments and determine an offset between the location of the segments of the device placement area laser line portion and the location of the shoulder area laser line portion.

4. The apparatus of claim 1, wherein the processor is further configured to: divide an image of the device holder into a plurality of quadrants that each include at least a portion of an edge of the device holder; and compare images within each of the quadrants to predetermined normal images of the quadrants, wherein the step of determining at least one of (i) whether an electronic device is positioned in the device placement area, (ii) whether an electronic device is positioned incorrectly in the device holder, (iii) whether two electronic devices are improperly double stacked in the device holder, and (iv) whether no electronic device is located in the device placement area, is further based on the comparison of said images within each of the quadrants with said predetermined normal images of the quadrants.

5. The apparatus of 4, wherein the processor is further configured to, after dividing the image of the device holder into the quadrants, mask at least a portion of at least one of the quadrants.

6. The apparatus of claim 1, wherein the electronic device is determined to be positioned in the device placement area when the offset between the device placement area laser line portion and the shoulder area laser line portion is within a predetermined range.

7. The apparatus of claim 1, wherein the processor is further configured to: determine an angle of the device placement area laser line portion, and determine, based on a comparison between said angle and a predetermined normal angle, at least one of (i) whether an electronic device is positioned in the device placement area, (ii) whether an electronic device is positioned incorrectly in the device holder, (iii) whether two electronic devices are improperly double-stacked in the device holder, and (iv) whether no electronic device is located in the device placement area.

8. The apparatus of claim 1, wherein two electronic devices are determined to be improperly double-stacked in the device holder when an offset between the device placement area laser line portion and the shoulder area laser line portion is below a predetermined lower threshold value.

9. The apparatus of claim 1, wherein the processor is configured to determine that no electronic device is located in the device placement area when an offset between the device placement area laser line portion and the shoulder area laser line portion is above a predetermined upper threshold value.

10. The apparatus of claim 1, wherein the device holder is a test socket comprising at least one electrical contact configured for testing the device.

11. The apparatus of claim 1, wherein the device holder is a pocket of a tray configured to hold the device during transport.

12. The apparatus of claim 10, wherein the processor is configured to determine whether the test socket is missing.

13. The apparatus of claim 10, wherein the processor is configured to determine whether the test socket is misplaced.

14. The apparatus of claim 10, wherein the processor is configured to determine whether the test socket is damaged.

15. The apparatus of claim 10, wherein the processor is configured to determine whether the test socket is of an incorrect type.

16. The apparatus of claim 10, wherein the processor is configured to determine whether the test socket has experienced thermal expansion.

17. A method comprising: providing a device holder comprising a device placement area configured to hold an electronic device, and a shoulder extending peripherally around the device placement area; generating, with a laser line generator, a laser line that includes (i) a device placement area laser line portion extending across at least a portion of the device placement area or at least a portion of an electronic device held in the device placement area, and (ii) a shoulder area laser line portion extending across at least a portion of the shoulder; obtaining, with a camera, an image of at least the laser line generated by the laser line generator; transferring the image from the camera to a processor; determining, with the processor, an offset between the location of the device placement area laser line portion and the location of the shoulder area laser line portion; and determining, with the processor, based on a comparison between said offset and a predetermined normal offset, at least one of (i) whether an electronic device is positioned in the device placement area, (ii) whether an electronic device is positioned incorrectly in the device holder, (iii) whether two electronic devices are improperly double-stacked in the device holder, and (iv) whether no electronic device is located in the device placement area.

18. The method of claim 17, wherein the laser line generator is configured such that an emission direction of a beam forming the laser line is at an angle in a range of 30-60 degrees with respect to a direction perpendicular to an upper surface of the device placement area.

19. The method of claim 17, wherein the processor divides the device placement area laser line portion into a plurality of laser line segments and determines at an offset between the location of the segments of the device placement area laser line portion and the location of the shoulder area laser line portion.

20. The method of claim 17, further comprising: dividing an image of the device holder into a plurality of quadrants that each include at least a portion of an edge of the device holder; and comparing images within each of the quadrants to predetermined normal images of the quadrants, wherein the step of determining at least one of (i) whether an electronic device is positioned in the device placement area, (ii) whether an electronic device is positioned incorrectly in the device holder, (iii) whether two electronic devices are improperly double stacked in the device holder, and (iv)

whether no electronic device is located in the device placement area, is further based on the comparison of said images within each of the quadrants with said predetermined normal images of the quadrants.

21. The method of 20, further comprising, after dividing the image of the device holder into the quadrants, masking at least a portion of at least one of the quadrants.

22. The method of claim 17, wherein the electronic device is determined to be positioned in the device placement area when the offset between the device placement area laser line portion and the shoulder area laser line portion is within a predetermined range.

23. The method of claim 17, further comprising: determining, with the processor, an angle of the device placement area laser line portion; and determining, with the processor, based on a comparison between said angle and a predetermined normal angle, at least one of (i) whether an electronic device is positioned in the device placement area, (ii) whether an electronic device is positioned incorrectly in the device holder, (iii) whether two electronic devices are improperly double-stacked in the device holder, and (iv) whether no electronic device is located in the device placement area.

24. The method of claim 17, wherein two electronic devices are determined to be improperly double-stacked in the device holder when an offset between the device placement area laser line portion and the shoulder area laser line portion is below a predetermined lower threshold value.

25. The method of claim 17, further comprising determining that no electronic device is located in the device placement area when an offset between the device placement area laser line portion and the shoulder area laser line portion is above a predetermined upper threshold value.

26. The method of claim 17, wherein the device holder is a test socket comprising at least one electrical contact configured for testing the device.

27. The method of claim 17, wherein the device holder is a pocket of a tray configured to hold the device during transport.

28. The method of claim 26, further comprising determining, with the processor, whether the test socket is missing.

29. The method of claim 26, further comprising determining, with the processor, whether the test socket is misplaced.

30. The method of claim 26, further comprising determining, with the processor, whether the test socket is damaged.

31. The method of claim 26, further comprising determining, with the processor, whether the test socket is of an incorrect type.

32. The method of claim 26, further comprising determining, with the processor, whether the test socket has experienced thermal expansion.

33. The apparatus of claim 7, wherein the electronic device is determined to be positioned in the device placement area when the angle of the device placement area laser line portion is within a predetermined range.

34. The apparatus of claim 33, wherein the processor is configured to divide the device placement area laser line portion into a plurality of laser line segments and determine an angle of the segments of the device placement area laser line portion.

35. The method of claim 23, wherein the electronic device is determined to be positioned in the device placement area when the angle of the device placement area laser line portion is within a predetermined range.

36. The method of claim 35, wherein the processor divides the device placement area laser line portion into a plurality of laser line segments and determines an angle of the segments of the device placement area laser line portion.

37. The apparatus of claim 1, wherein the laser line generator is configured to generate exactly one laser line at any given time.

38. The method of claim 17, wherein the method is performed using exactly one laser line at any given time.

39. An apparatus comprising: a device holder comprising a device placement area configured to hold an electronic device, and a shoulder extending peripherally around the device placement area; a laser line generator configured to generate a laser line that includes (i) a device placement area laser line portion extending across at least a portion of the device placement area or at least a portion of an electronic device held in the device placement area, and (ii) a shoulder area laser line portion extending across at least a portion of the shoulder; a camera configured to obtain an image of at least the laser line generated by the laser line generator; and a processor configured to: receive the image from the camera, determine (i) an angle of the device placement area laser line portion, and/or (ii) an offset between the location of the device placement area laser line portion and the location of the shoulder area laser line portion, divide an image of the device holder into a plurality of quadrants that each include at least a portion of an edge of the device holder, compare images within each of the quadrants to predetermined normal images of the quadrants, and determine, based on a comparison between said angle and/or offset and a predetermined normal angle and/or normal offset, and based on the comparison of said images within each of the quadrants with said predetermined normal images of the quadrants, at least one of (i) whether an electronic device is positioned in the device placement area, (ii) whether an electronic device is positioned incorrectly in the device holder, (iii) whether two electronic devices are improperly double-stacked in the device holder, and (iv) whether no electronic device is located in the device placement area.

40. An apparatus comprising: a device holder comprising a device placement area configured to hold an electronic device, and a shoulder extending peripherally around the device placement area; a laser line generator configured to generate a laser line that includes (i) a device placement area laser line portion extending across at least a portion of the device placement area or at least a portion of an electronic device held in the device placement area, and (ii) a shoulder area laser line portion extending across at least a portion of the shoulder; a camera configured to obtain an image of at least the laser line generated by the laser line generator; and a processor configured to: receive the image from the camera, determine (i) an angle of the device placement area laser line portion, and/or (ii) an offset between the location of the device placement area laser line portion and the location of the shoulder area laser line portion, and determine, based on a comparison between said angle and/or offset and a predetermined normal angle and/or normal offset, at least one of (i) whether an electronic device is positioned in the device placement area, (ii) whether an electronic device is positioned incorrectly in the device holder, (iii) whether two electronic devices are improperly double-stacked in the device holder, and (iv) whether no electronic device is located in the device placement area; wherein the device holder is a pocket of a tray configured to hold the device during transport; and wherein the processor is configured to determine whether the test socket is missing, is misplaced, is damaged, is of an incorrect type, and/or has experienced thermal expansion.

\* \* \* \* \*